US012635262B2

(12) United States Patent
Kim et al.

(10) Patent No.: US 12,635,262 B2
(45) Date of Patent: May 19, 2026

(54) REUSABLE PHOTOVOLTAIC MODULE

(71) Applicant: KOREA INSTITUTE OF ENERGY RESEARCH, Daejeon (KR)

(72) Inventors: Kyung Soo Kim, Daejeon (KR); Young Joo Eo, Daejeon (KR); Soo Hyun Bae, Daejeon (KR); Gi Hwa Kang, Sejong-si (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 0 days.

(21) Appl. No.: 18/763,926

(22) Filed: Jul. 3, 2024

(65) Prior Publication Data

US 2025/0287703 A1      Sep. 11, 2025

(30) Foreign Application Priority Data

Mar. 8, 2024      (KR) ........................ 10-2024-0033228

(51) Int. Cl.
H10F 19/40            (2025.01)
H10F 19/80            (2025.01)
H10F 77/00            (2025.01)
(52) U.S. Cl.
CPC ............. H10F 19/40 (2025.01); H10F 19/80 (2025.01); H10F 77/939 (2025.01)
(58) Field of Classification Search
CPC ................................ H01F 19/40; H01F 19/80
See application file for complete search history.

(56) References Cited

U.S. PATENT DOCUMENTS

2008/0041434 A1*    2/2008   Adriani ................... H02S 40/36
                                                                           136/244
2008/0302030 A1    12/2008   Stancel et al.

FOREIGN PATENT DOCUMENTS

DE            10054349 A1 *   5/2002    ............. H10F 19/90
JP              3245211 B2    1/2002
JP              7022467 B1    2/2022
KR    10-2022-0106454 A      7/2022
KR    10-2022-0138116 A     10/2022
KR    10-2023-0100343 A      7/2023
KR    10-2023-0123651 A      8/2023

OTHER PUBLICATIONS

DE 10054349 A1 English Translaiton provided by FIT database, translated on Oct. 31, 2025.*

* cited by examiner

*Primary Examiner* — Golam Mowla
(74) *Attorney, Agent, or Firm* — Birch, Stewart, Kolasch & Birch, LLP

(57)            ABSTRACT

Proposed is a solar photovoltaic module that is easily recyclable. In the solar photovoltaic module disclosed herein, each component is coupled to each other in a physical manner. Therefore, since the solar photovoltaic module may be physically separated, recycling of the solar photovoltaic module may be very easily performed.

12 Claims, 6 Drawing Sheets

REUSABLE PHOTOVOLTAIC MODULE

CROSS REFERENCE TO RELATED APPLICATION

The present application claims priority to Korean Patent Application No. 10-2024-0033228, filed Mar. 8, 2024, the entire contents of which are incorporated by reference herein for all purposes.

BACKGROUND OF THE INVENTION

Field of the Invention

The present disclosure relates to a photovoltaic module. Particularly, the present disclosure relates to a photovoltaic module in which each of configurations is easily separated and is capable of being recycled for a variety of purposes.

Description of the Related Art

Photovoltaic modules are devices that convert sunlight into electric energy, and are representative green energy devices. As the importance of environmental protection has emerged, the global photovoltaic power generation market has continuously grown since the mid-2010. As the solar photovoltaic power generation market continuously grows, the number of solar photovoltaic module installations has continuously increased.

Solar photovoltaic modules utilize an infinite amount of solar energy, but solar photovoltaic modules have limited lifespans. Solar photovoltaic modules that have reached the end of their lifespans are required to be collected and discarded. In addition, when damage occurs to solar photovoltaic modules due to a natural disaster, a fire, physical damage, and so on and the solar photovoltaic modules are in an unusable state, the solar photovoltaic modules are required to be discarded.

However, disposing of solar photovoltaic modules is an action contrary to the principle of protecting the environment. Recently, research has been conducted to recycle useful materials of solar photovoltaic modules without disposing of the solar photovoltaic modules.

Solar photovoltaic modules are devices in which frames, glass, sealing materials, solar cells, sealing materials, back sheets, junction boxes, and so on are coupled to each other. In order to separate the components, physical, chemical, thermal, optical, and electrical processes are required to be performed respectively. Aluminum, silicon, copper, and so on are recovered only when such a separation process is performed.

However, in this process, processes in different fields are respectively performed, so that complexity is increased.

Document of Related Art (Patent Document 1) Japanese Patent No. 3245211 (Published on Dec. 27, 2023)
(Patent Document 2) Korean Patent Application Publication No. 2023-0100343 (Published on Jul. 5, 2023)
(Patent Document 3) Japanese Patent No. 7022467 (Published on Feb. 9, 2022)

SUMMARY

This research was financially supported by national R&D programs through the Korea Institute of Energy Research (KIER) (grant no. C4-2414). This work was also partly supported by Korea Institute of Energy Technology Evaluation and Planning (KETEP) grant funded by the Korea government (MOTIE) (grant nos. 20208701010040 and RS-2023-00303745)

Accordingly, the present disclosure has been made keeping in mind the above problems occurring in the related art, and an objective of the present disclosure is to provide a solar photovoltaic module that is easily reusable.

According to an embodiment of the present disclosure, there is provided a solar photovoltaic module including: a base part on which a fixing part including a plurality of fixing parts that are not flat is formed; a solar cell part positioned on the fixing part; and a wire part disposed in contact with a first surface of the fixing part and disposed in contact with a first surface of the solar cell part.

The solar cell part may be positioned on the fixing part by being spaced apart from the fixing part so that the fixing part is not positioned on a first side or a second side of the solar cell part.

The fixing part may protrude in a rounded manner.

The solar cell part may have a shape corresponding to the fixing part.

Point parts with the fixing part positioned therebetween may be formed on the base part, and the wire part may be disposed on the point parts with the fixing part positioned therebetween.

Tension parts may be spaced apart from each other between the fixing part, and the solar cell part disposed on the fixing part may have the first side and the second side in contact with the tension parts.

A length from the first side to the second side of the solar cell part may be longer than a length between the tension parts that are disposed in a corresponding manner, so that a shape of the solar cell part may be modified by being pressed due to a difference in length between the solar cell part and the tension parts when the solar cell part is disposed between the tension parts.

A cover part through which light is transmitted may be disposed on first surfaces of the base part and the solar cell part.

A plurality of alignment protrusions that protrudes and presses the wire part may be formed on a second surface of the cover part.

When the cover part is aligned and positioned, the alignment protrusions may be positioned between the point parts and the tension parts, and when the second surface of the cover part is positioned by being spaced apart by a predetermined distance from the first surface of the base part, the alignment protrusions may press the wire part and the wire part pressed by the alignment protrusions may not be in contact with the base part.

A sealing part may be disposed along a circumference of the base part.

A terminal part to which the wire part is connected may be provided on a first side of the base part, a connection groove may be provided in the terminal part, and a connection terminal electrically connected and fixed to the connection groove may be connected to and disposed in the connection groove.

According to an embodiment of the present disclosure, unlike an existing solar photovoltaic module, each component constituting the solar photovoltaic module of the present disclosure is physically formed and is physically coupled to each other. Therefore, when recycling is performed, only a physical process is performed, so that each component is conveniently separated and conveniently recycled.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
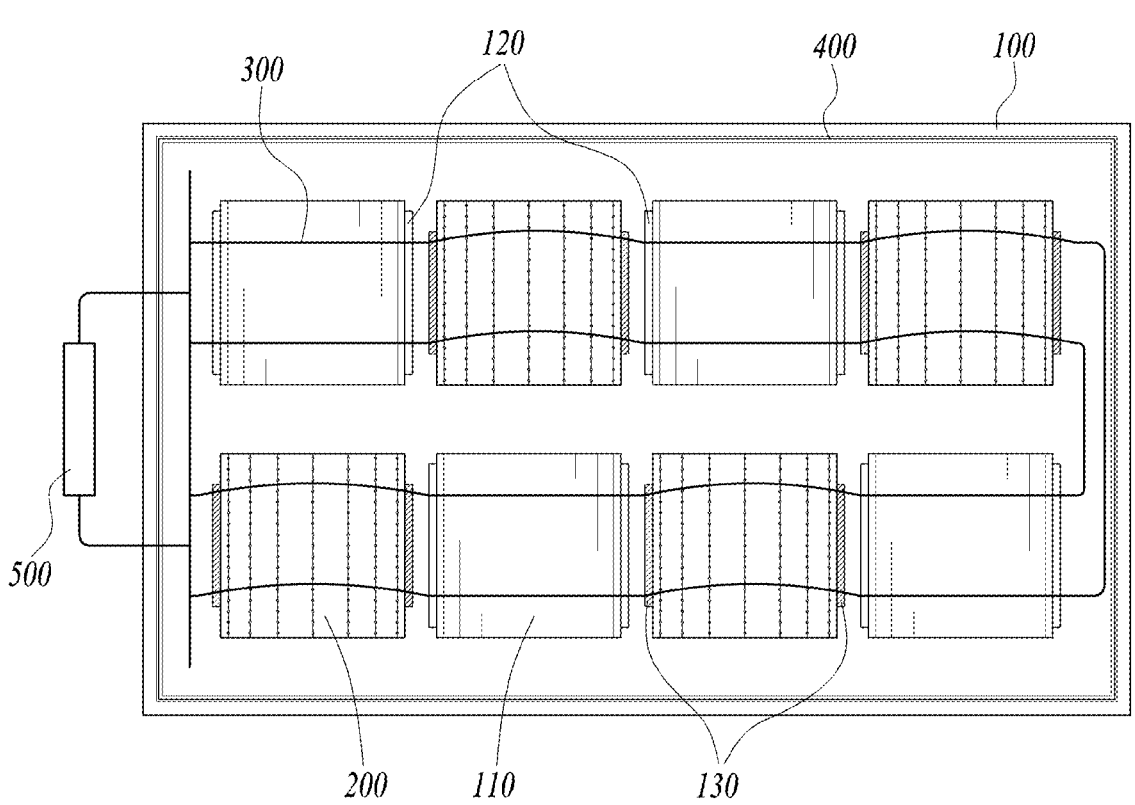
FIG. 1 is a top view illustrating a solar photovoltaic module according to an embodiment of the present disclosure.

Hereinafter, an embodiment of the present disclosure will be described in detail with reference to the accompanying drawings. However, this is not intended to limit the scope of the present disclosure.

In adding reference numerals to components throughout the drawings, it is to be noted that like or similar reference numerals designate like or similar components even though the components are illustrated in different drawings. In addition, in describing the present disclosure, when it is determined that a detailed description of a related known configuration or function may obscure the gist of the present disclosure, the detailed description thereof will be omitted.

In addition, the sizes, the shapes, and so on of components illustrated in the drawings may be exaggerated for convenience of understanding. In addition, terms specially defined by taking the configurations and functions of the present disclosure into consideration are provided only for illustrate embodiments of the present disclosure while not being limitative.

FIG. 1 is a top view illustrating a solar photovoltaic module according to an embodiment of the present disclosure.

A solar photovoltaic module in which each of components according to an embodiment of the present disclosure is physically connected and disposed may include a base part 100, a solar cell part 200, a wire part 300, a sealing part 400, and a terminal part 500.

The base part 100 serves as a base plate of the solar photovoltaic module of the present disclosure. For example, the base part 100 may be formed in a rectangular shape, other components may be positioned on an upper surface of the base part 100, and a lower surface of the base part 100 may be formed flat and may be disposed on a ground surface, a roof, a wall, and so on. A fixing part 110, a point part 120, and a tension part 130 are disposed on the base part 100.

The fixing part 110 is formed on the upper surface of the base part 100. The fixing part 110 is formed in a shape that protrudes upward. The fixing part 110 may be formed in a shape that smoothly protrudes from the left side and the right side toward the center. That is, the fixing part 110 may be formed in a shape of a portion of a circle having a large radius.

A plurality of fixing parts 110 is disposed. The plurality of fixing parts 110 is disposed to be spaced apart from each other. The fixing part 110 may electrically have a first pole. The fixing part 110 may have a + polarity.

The point parts 120 are disposed to be spaced apart from each other with the fixing part 110 therebetween. The point parts 120 are not formed corresponding to all fixing parts 110, but are formed corresponding to some of the fixing parts 110. As illustrated in FIG. 1, the point parts 120 are positioned corresponding to the fixing part 110 positioned at the top left side, are positioned corresponding to the fixing part 110 that is skipped one space to the right side (a third position from the left side) from the fixing part 110 positioned at the top left side, are positioned corresponding to the fixing part 110 positioned at the bottom right side, and are positioned corresponding to the fixing part 110 that is skipped one space to the left side from the fixing part 110 positioned at the bottom right side. The fixing part 110 is a point to which the wire part 300 is connected. The point part 120 may serve to connect the left side and the right side of the wire part 300 conducting electricity.

The tension parts 130 are spaced apart from each other with the fixing part 110 therebetween. Similar to the point parts 120, the tension parts 130 are formed corresponding to some of the fixing parts 110. However, the tension parts 130 are formed corresponding to the fixing parts 110 on which the point parts 120 are not formed.

The tension parts 130 are formed on the fixing parts 110 other than the fixing parts 110 on which the point parts 120 described above are formed. The tension parts 130 are in contact with a left side and a right side of the solar cell part 200, thereby being capable of bending the solar cell part 200.

The solar cell part 200 is disposed on the fixing part 110. The solar cell part 200 may be positioned corresponding to the fixing part 110 on which the tension parts 130 are formed. Therefore, in the present disclosure, when the upper surface of the present disclosure is observed from the left side to the right side, the present disclosure may be formed in the order of the fixing part 110, the solar cell part 200, the fixing part 110, and the solar cell part 200. When the solar cell part 200 receives sunlight, the solar cell part 200 generates energy. The energy may be moved through a wire. The solar cell part 200 has a second pole. The solar cell part 200 may have a − polarity. Therefore, the fixing part 110 and the solar cell part 200 may be + and − poles, respectively. Meanwhile, the solar cell part 200 may include a flexible film and is capable of being bent by external force.

The wire part 300 has a conductivity, and is configured to move energy generated in the solar cell part 200.

The wire part 300 is alternately connected to the fixing part 110 and the solar cell part 200 in the order of the fixing part 110 and the solar cell part 200, thereby allowing the electric energy generated in the solar cell part 200 to flow and move. Unlike a conventional solar photovoltaic module, the wire part 300 may be a wire having actual conductivity. The wire part 300 may be connected to the point part 120.

Meanwhile, the wire part 300 may diverge from a portion thereof and may converge to other portion thereof.

The sealing part 400 is disposed along the circumference of the base part 100. The sealing part 400 serves to seal a space between the base part 100 and a cover part 600 (see FIG. 5 that will be described later) when the cover part 600 is positioned on the upper surface of the base part 100. Therefore, the sealing part 400 may prevent moisture, dust, and so on from being positioned in the space sealed by the base part 100 and the cover part 600.

The terminal part 500 is connected to the wire part 300. The wire part 300 forms an electrically closed circuit. The terminal part 500 may be connected to each end portion of the wire part 300. A diode is disposed in the terminal part 500, so that current flowing in a first direction is capable of being only allowed. The terminal part 500 may be connected to a battery that is not illustrated. Therefore, the energy that flows through the wire part 300 may be transferred to and stored in the battery through the terminal part 500.

The solar photovoltaic module of the present disclosure formed in such a configuration is formed of physical components. Therefore, the installation of the present disclosure is also different from the installation of the existing solar photovoltaic module. In the present disclosure, the solar photovoltaic module may be formed in the following manner.

In the present disclosure, the base part 100 on which the fixing part 110 is formed is positioned, the terminal part 500 is positioned on the left side of the base part 100, and the wire part 300 is connected first. When the wire part 300 is connected with respect to the point part 120, the connection of the wire part 300 may be very easily performed.

Then, the solar cell part 200 is positioned between the wire part 300 and the fixing part 110. The solar cell part 200 may be formed in a round shape since the left side and the right side of the solar cell part 200 are in contact with the tension parts 130.

Then, the cover part 600 is positioned on the upper surface of the base part 100 (not illustrated in detail in FIG. 1). By the cover part 600, the solar cell part 200 and the wire part 300 are naturally pressed, so that the wire part 300 may be connected in the order of the fixing part 110, the solar cell part 200, the fixing part 110, and the solar cell part 200 (the detailed description will be described later with reference to the drawings). Here, when the sealing part 400 is disposed in a shape in which a gap between the base part 100 and the cover part 600 is closed, the assembly of the solar photovoltaic module of the present disclosure may be completed.

When the solar photovoltaic module of the present disclosure is intended to be separated and recycled, all components of the solar photovoltaic module of the present disclosure may be separated by only removing the wire part 300 after the sealing part 400 is removed and then the cover part 600 is spaced apart from the base part 100. Therefore, the solar photovoltaic module of the present disclosure may be very easily recyclable. The characteristics of the solar photovoltaic module of the present disclosure will be described below in detail.

Figure 2:
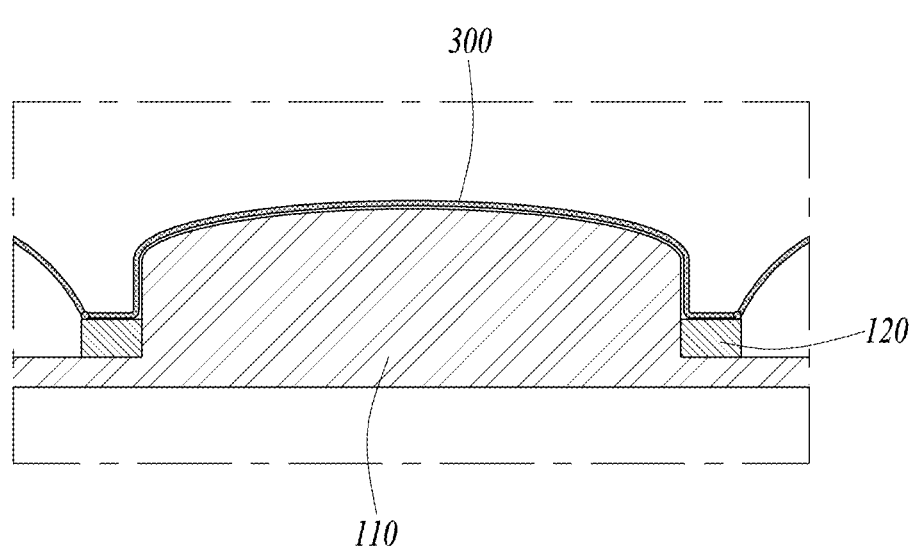
FIG. 2 is an enlarged view illustrating a fixing part and a point part of a base part according to an embodiment of the present disclosure.

FIG. 2 is an enlarged view illustrating the fixing part and the point part of the base part according to an embodiment of the present disclosure.

Referring to FIG. 2, the fixing part 110 may be formed on the upper surface of the base part 100 (see FIG. 1), and the cross-sectional shape of the fixing part 110 may be formed in a square shape having a round upper surface. The point parts 120 may be formed on the left side and the right side of the fixing part 110 with the fixing part 110 therebetween. The point part 120 is formed such that the end portion of the wire part 300 is connected to the point part 120. The point part 120 serves as a connection point to which the wire part 300 is connected.

The wire part 300 may be formed such that the wire part 300 is in contact with the fixing part 110 between the point parts 120. That is, as illustrated in FIG. 2, the wire part 300 may be disposed such that the left side and the right side of the wire part 300 are connected to the point parts 120 and the wire part 300 surrounds the fixing part 110.

Figure 3:
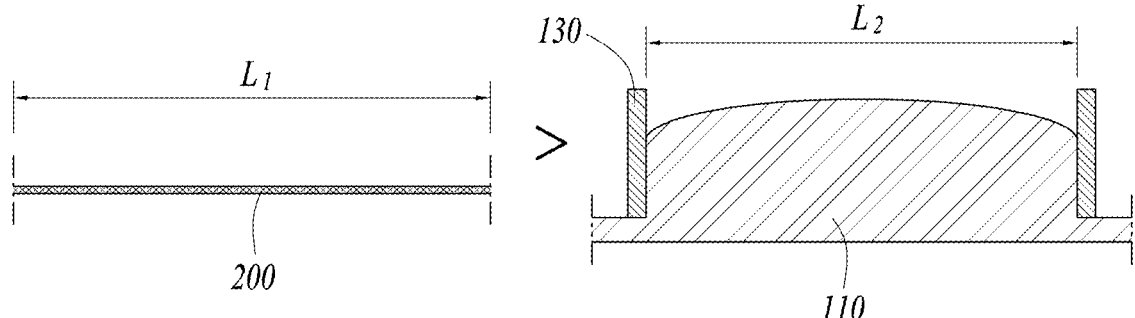
FIG. 3 is a view illustrating a difference in length between a solar cell part and a space between the fixing parts according to an embodiment of the present disclosure.
Figure 4:
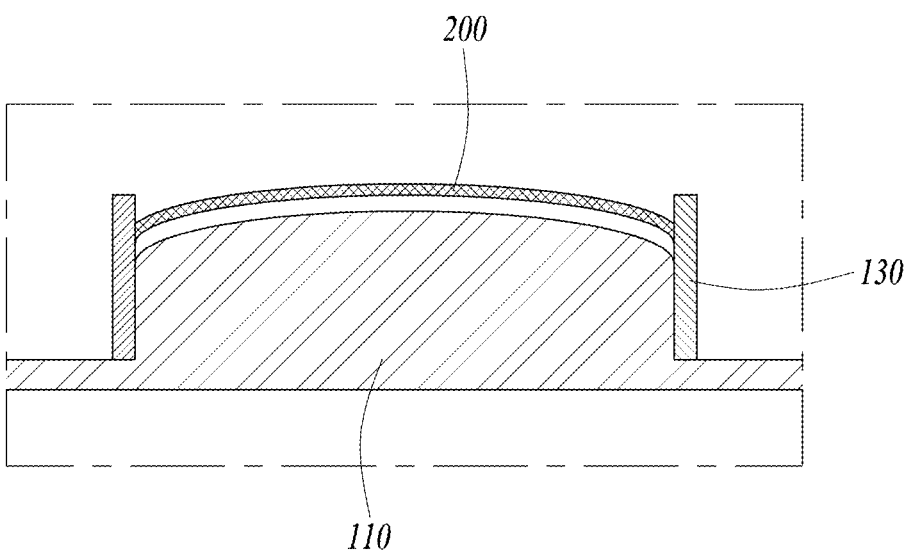
FIG. 4 is a view illustrating the solar cell part disposed on the fixing part according to an embodiment of the present disclosure.

FIG. 3 is a view illustrating a difference in length between the solar cell part and a space between the fixing parts according to an embodiment of the present disclosure, and FIG. 4 is a view illustrating the solar cell part disposed on the fixing part according to an embodiment of the present disclosure.

As can be seen by referring to FIG. 3, in the present disclosure, a horizontal length L1 of the solar cell part 200 may be formed longer than a horizontal length L2 of the fixing part 110. Therefore, when the solar cell part 200 is positioned on the upper surface of the fixing part 110, the solar cell part 200 may be disposed such that portions of the left side and the right side of the solar cell part 200 are not supported by the fixing part 110. However, in the present disclosure, the tension parts 130 are disposed with the fixing part 110 therebetween.

As illustrated in FIG. 4, since the tension part 130 protrudes upward from the upper surface of the fixing part 110, the solar cell part 200 positioned on the upper surface of the fixing part 110 may be disposed such that the left side and the right side of the solar cell part 200 are in contact with the tension parts 130 and the solar cell part 200 is disposed in the round shape.

Figure 5A:
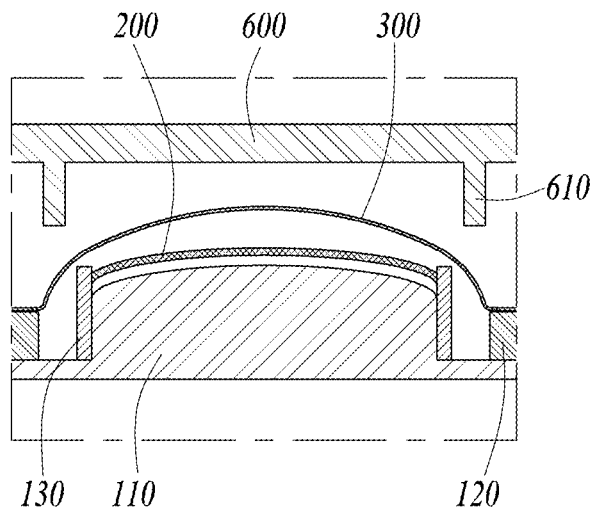
FIG. 5A is a view illustrating a state in which a cover part is positioned and aligned with the base part according to an embodiment of the present disclosure.
Figure 5B:
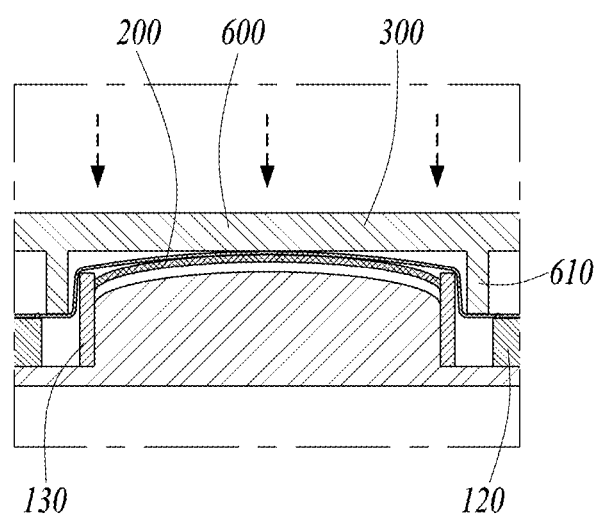
FIG. 5B is a view illustrating a state in which the cover part is positioned by being spaced apart from the base part by a predetermined distance after the cover part is aligned with the base part according to an embodiment of the present disclosure.

In FIG. 5A and FIG. 5B, FIG. 5A is a view illustrating a state in which the cover part is positioned and aligned with the base part according to an embodiment of the present disclosure, and FIG. 5B is a view illustrating a state in which the cover part is positioned by being spaced apart from the base part by a predetermined distance after the cover part is aligned with the base part according to an embodiment of the present disclosure.

The wire part 300 is positioned such that the wire part 300 faces the upper surface of the solar cell part 200 by the point part 120 with the fixing part 110 therebetween, the fixing part 110 having the solar cell part 200 positioned on the upper surface of the fixing part 110. At this time, as can be seen in FIG. 5A, since the wire part 300 has a long length, the wire part 300 may not be in contact with the solar cell part 200 when a specific external force is not applied to the wire part 300.

In the present disclosure, only by pressing the base part 100 by the cover part 600, the wire part 300 may be aligned and may be connected to the solar cell part 200. The cover part 600 may be a transparent glass. Therefore, light may transmit the cover part 600. A plurality of alignment protrusions 610 may be formed on the cover part 600 corresponding to the tension parts 130.

The alignment protrusion 610 protrudes downward from a lower surface of the cover part 600. A length between the corresponding alignment protrusions 610 may be longer than a length between the corresponding tension parts 130.

In addition, the length between the corresponding alignment protrusions 610 may be shorter than a length between the point parts 120 illustrated in FIG. 5A. Therefore, when the cover part 600 is aligned and positioned, the point part 120 and the tension part 130 may be positioned on opposite sides of the alignment protrusion 610 with respect to the alignment protrusion 610.

As illustrated in FIG. 5B, when the cover part 600 is aligned and positioned close to the base part 100, the alignment protrusion 610 is in contact with the wire part 300 so that the wire part 300 is moved downward. At the same time, the cover part 600 may press the solar cell part 200. At this time, the wire part 300 is pressed again by the cover part 600. Furthermore, due to the degree to which the wire part 300 is pressed by the cover part 600, the wire part 300 may be in contact with the solar cell part 200 beyond an upper side of the tension part 130. Therefore, the wire part 300 may only be in contact with the solar cell part 200, not the fixing part 110.

Meanwhile, to this end, the alignment protrusion 610 should not be in contact with the base part 100, which may be realized by maintaining the gap through manual work of the worker or may be realized by the sealing part 400.

As such, in the present disclosure, the solar cell part 200 is disposed, the cover part 600 is aligned, and the cover part 600 is disposed, so that each component is easily coupled to each other and convenience of manufacturing may be promoted.

Figure 6:
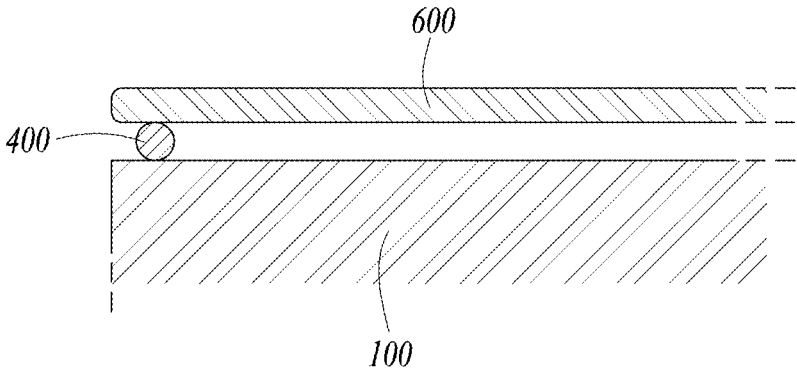
FIG. 6 is a view illustrating a sealing part and the cover part according to an embodiment of the present disclosure.

FIG. 6 is a view illustrating the sealing part and the cover part according to an embodiment of the present disclosure.

The sealing part 400 is disposed between the base part 100 and the cover part 600. Since the sealing part 400 is formed in a closed shape, the sealing part 400 serves to block the inner and outer sides of the sealing part 400. Therefore, the sealing part 400 may prevent moisture, dust, and so on from being introduced between the base part 100 and the cover part 600. As an example, the sealing part 400 may be formed in a shape of a bar having an elastic force, and may be formed in a shape in which the bar is disposed while having a specific shape. Here, the sealing part 400 may be connected to the cover part 600 and the base part 100 through an adhesive that is not illustrated.

Figure 7:
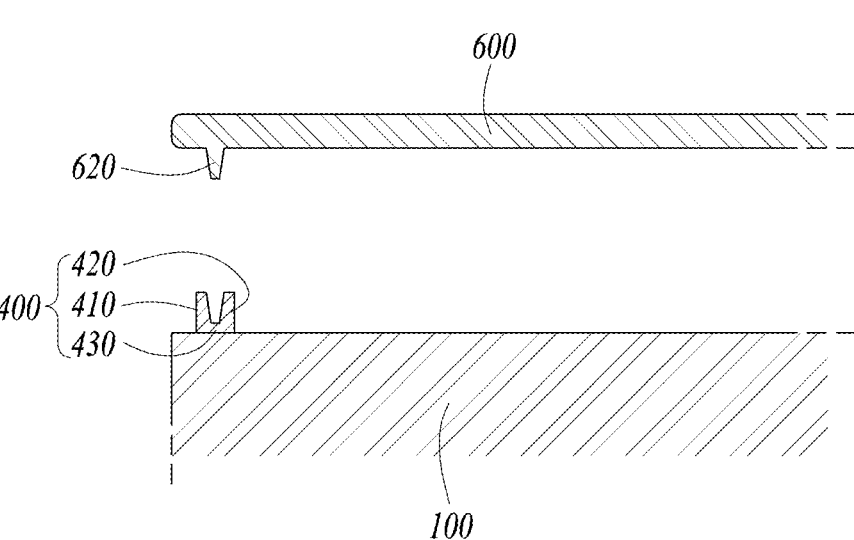
FIG. 7 is a view illustrating the sealing part and the cover portion according to another embodiment of the present disclosure.

FIG. 7 is a view illustrating the sealing part and the cover part according to another embodiment of the present disclosure.

The sealing part 400 may include a first sealing part 410, a second sealing part 420, and a third sealing part 430. According to another embodiment, the sealing part 400 may be formed in a '[' shape. That is, the sealing part 400 may be formed in a shape in which each of the first sealing part 410 and the second sealing part 420 are spaced apart from each other and protrude upward. Here, the third sealing part 430 may connect the first sealing part 410 and the second sealing part 420 to each other. The first sealing part 410 may be disposed vertically, the second sealing part 420 may be disposed vertically, and the third sealing part 430 may be disposed horizontally.

A sealing protrusion 620 that protrudes downward may be formed on a lower surface of the cover part 600. When the cover part 600 is aligned and positioned on the base part 100, and the cover part 600 is disposed adjacent to the base part 100, the sealing protrusion 620 may be disposed such that the left side of the sealing protrusion 620 is surrounded by the first sealing part 410, the right side of the sealing protrusion 620 is surrounded by the second sealing part 420, and the lower side of the sealing protrusion 620 is surrounded by the third sealing part 430. In the present disclosure, since the sealing protrusion 620 of the cover part 600 is fixed by being in contact with the sealing part 400, moisture, dust, and so on may not be positioned between the cover part 600 and the base part 100.

Figure 8:
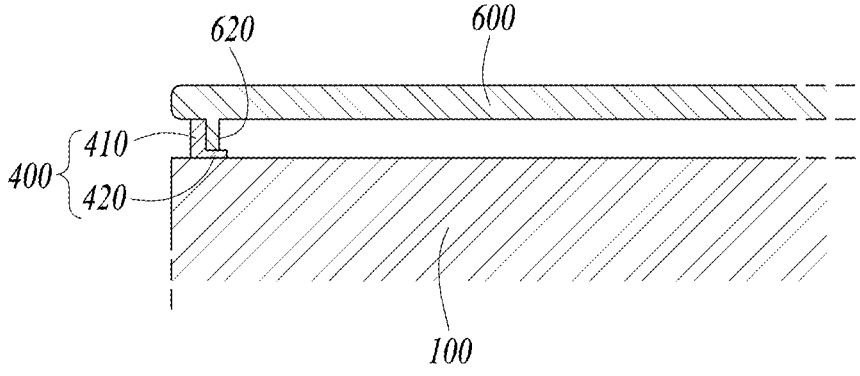
FIG. 8 is a view illustrating the sealing part and the cover part according to still another embodiment of the present disclosure.

FIG. 8 is a view illustrating the sealing part and the cover part according to still another embodiment of the present disclosure.

According to still another embodiment, the sealing part 400 may include a first sealing part 410 and a second sealing part 420.

The first sealing part 410 may be disposed along a vertical direction, and the second sealing part 420 may be disposed along a horizontal direction. According to still another embodiment, a difference between the sealing part 400 of the still another embodiment and the sealing part 400 described in FIG. 7 may be an arrangement relationship and a connection relationship between the first sealing part 410 and the second sealing part 420, and may be the presence or absence of the third sealing part 430.

However, as the basic principle of each embodiment is similar, sealing may be performed by fixing the sealing protrusion 620 after the sealing protrusion 620 is disposed on the sealing part 400. Here, the second sealing part 420 may be telescoped by the sealing protrusion 620, and may be closely connected to the cover part 600. The first sealing part 410 may close a gap between the sealing protrusion 620 and the second sealing part 420 (the base part 100).

Figure 9:
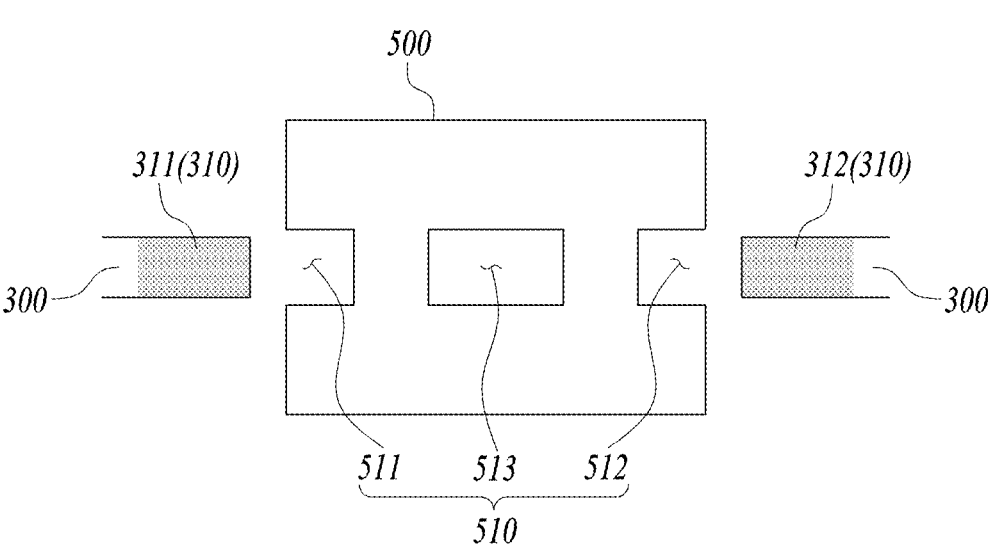
FIG. 9 is a view illustrating a terminal part according to an embodiment of the present disclosure.

FIG. 9 is a view illustrating the terminal part according to an embodiment of the present disclosure.

The terminal part 500 according to an embodiment may include a connection groove 510.

That is, the terminal part 500 may include a first connection groove 511 on the left side, a second connection groove 512 on the right side, and a third connection groove 513 in the middle side. Respective connection terminals 310 may be electrically connected to each of the connection grooves 510.

As an example, a first connection terminal 311 may be connected to a first side of the wire part 300, and a second connection terminal 312 may be connected to a second side of the wire part 300. In addition, the first connection terminal 311 of the wire part 300 may be connected to the first connection groove 511, and the second connection terminal 312 of the wire part 300 may be connected to the second connection groove 512. Since the terminal part 500 is electrically connected to the wire part 300, energy generated from the solar cell part 200 may be transmitted to the terminal part 500 through the wire part 300.

In addition, the battery that is not illustrated may be connected to the third connection groove 513 through the connection terminal 310. Therefore, energy is supplied to the battery through the terminal part 500, and the battery may store the energy.

In addition, when the present disclosure is configured as described above, the terminal part 500 and the wire part 300 are capable of being conveniently separated from each other, so that the present disclosure may be easily recycled.

Although exemplary embodiments of the present disclosure have been described herein, it is understood that the present disclosure should not be limited to these exemplary embodiments and that various changes and modifications can be made by one ordinary skilled in the art within the spirit and scope of the present disclosure.

What is claimed is:

1. A solar photovoltaic module comprising:
a base part on which a fixing part comprising a plurality of fixing parts that are not flat is formed, wherein the plurality of fixing parts are spaced apart from each other;

a solar cell part positioned on a fixing part selected from the plurality of fixing parts, wherein the solar cell part is positioned to cover a first surface of the fixing part on which the solar cell part is positioned; and a wire part disposed in contact with a first surface of a fixing part on which the solar cell part is not positioned and disposed in contact with a first surface of the solar cell part, wherein the wire part is disposed along the first surface of the fixing part on which the solar cell part is not positioned and along the first surface of the solar cell part in a length direction of the solar cell part.

2. The solar photovoltaic module of claim 1, wherein the solar cell part is positioned on the fixing part by being spaced apart from the fixing part so that the fixing part is not positioned on a first side or a second side of the solar cell part.

3. The solar photovoltaic module of claim 2, wherein the fixing part protrudes in a rounded manner.

4. The solar photovoltaic module of claim 3, wherein the solar cell part has a shape corresponding to the fixing part.

5. The solar photovoltaic module of claim 2, wherein point parts with the fixing part positioned therebetween are formed on the base part, and wherein the wire part is disposed on the point parts with the fixing part positioned therebetween.

6. The solar photovoltaic module of claim 5, wherein tension parts are spaced apart from each other between the fixing part, and wherein the solar cell part disposed on the fixing part has the first side and the second side in contact with the tension parts.

7. The solar photovoltaic module of claim 6, wherein a length from the first side to the second side of the solar cell part is longer than a length between the tension parts that are disposed in a corresponding manner, so that a shape of the solar cell part is modified by being pressed due to a difference in length between the solar cell part and the tension parts when the solar cell part is disposed between the tension parts.

8. The solar photovoltaic module of claim 6, wherein a cover part through which light is transmitted is disposed on first surfaces of the base part and the solar cell part.

9. The solar photovoltaic module of claim 8, wherein a plurality of alignment protrusions that protrudes and presses the wire part is formed on a second surface of the cover part.

10. The solar photovoltaic module of claim 9, wherein when the cover part is aligned and positioned, the alignment protrusions are positioned between the point parts and the tension parts, and when the second surface of the cover part is positioned by being spaced apart by a predetermined distance from the first surface of the base part, the alignment protrusions press the wire part and the wire part pressed by the alignment protrusions is not in contact with the base part.

11. The solar photovoltaic module of claim 8, wherein a sealing part is disposed along a circumference of the base part.

12. The solar photovoltaic module of claim 1, wherein a terminal part to which the wire part is connected is provided on a first side of the base part, a connection groove is provided in the terminal part, and a connection terminal electrically connected and fixed to the connection groove is capable of being connected to and disposed in the connection groove.

* * * * *